(12) United States Patent
Yagi (10) Patent No.: US 6,771,470 B1
(45) Date of Patent: Aug. 3, 2004

(54) MAGNETIC HEAD ASSEMBLY HAVING A ROTATIONAL ARM FOR ELECTRICALLY CONNECTING THE MAGNETIC HEAD TO AN EXTERNAL CIRCUIT AND METHODS OF MANUFACTURING THE SAME

(75) Inventor: Ichiro Yagi, Tokyo (JP)

(73) Assignee: TDK Corporation, Tokyo (JP)

( * ) Notice: Subject to any disclaimer, the term of this patent is extended or adjusted under 35 U.S.C. 154(b) by 530 days.

(21) Appl. No.: 09/694,010

(22) Filed: Oct. 23, 2000

(30) Foreign Application Priority Data

Nov. 17, 1999 (JP) .......................................... 11-326727

(51) Int. Cl.⁷ .............................................. G11B 21/08
(52) U.S. Cl. .................................................. 360/264.2
(58) Field of Search .................... 360/264.2; 29/603.07, 29/603.03

(56) References Cited

U.S. PATENT DOCUMENTS

| | | | |
|---|---|---|---|
| 5,237,476 A | 8/1993 | Bischoff et al. ............ | 360/126 |
| 5,734,523 A | 3/1998 | Scheidecker et al. ..... | 360/235.5 |
| 5,943,190 A | 8/1999 | Fanslau, Jr. .............. | 368/245.3 |
| 6,163,443 A | * 12/2000 | Hatagami et al. ........... | 360/323 |

FOREIGN PATENT DOCUMENTS

| | | |
|---|---|---|
| EP | 0 918 320 A1 | 5/1999 |
| JP | 62-243668 | 10/1987 |
| JP | 03-046774 | 2/1991 |
| JP | 4-117469 | 10/1992 |
| JP | 5-036048 | 2/1993 |
| JP | 5-152112 | 6/1993 |
| JP | 7-029140 | 1/1995 |
| JP | 7-153170 | 6/1995 |
| JP | 2592773 | 12/1996 |
| JP | 9-063013 | 3/1997 |
| JP | 09073740 A | 3/1997 |
| JP | 9-128726 | 5/1997 |
| JP | 9-180380 | 7/1997 |
| JP | 09180380 A | 7/1997 |
| JP | 10092125 A | 4/1998 |
| JP | 10143833 A | 5/1998 |
| JP | 10162535 | 6/1998 |
| JP | 10241310 | 9/1998 |
| JP | 11045421 A | 2/1999 |
| JP | 11-312713 | 11/1999 |
| JP | 200207719 A | 7/2000 |
| JP | 2000-207719 | 7/2000 |
| WO | 93/15593 | 8/1993 |

* cited by examiner

*Primary Examiner*—David Davis
(74) *Attorney, Agent, or Firm*—Oliff & Berridge, PLC (57) ABSTRACT

A connecting portion of the external side FPC board connected to a control circuit provided outside of a magnetic head assembly and connecting terminals of arm side FPC boards respectively connected to magnetic heads are overlapped with an anisotropic conductive tape having anisotropic conductivity in the direction of thickness in between. The anisotropic conductive tape is applied pressure between the connecting portion and the connecting terminals with heating to a temperature of, for example, 150° C. and is set. As a result, the connecting portion and the connecting terminals are connected. The anisotropic conductive tape has anisotropic conductivity only in the direction of thickness so that conduction of wirings adjacent each other is prevented although a plurality of wirings is formed on the connecting portion and the connecting terminals.

15 Claims, 7 Drawing Sheets

MAGNETIC HEAD ASSEMBLY HAVING A ROTATIONAL ARM FOR ELECTRICALLY CONNECTING THE MAGNETIC HEAD TO AN EXTERNAL CIRCUIT AND METHODS OF MANUFACTURING THE SAME

BACKGROUND OF THE INVENTION

1. Field of the Invention

The present invention relates to a magnetic head assembly using for a magnetic disk apparatus or the like, to a method of manufacturing the same and to a method of wiring the same using for signal transmission between a magnetic head and external.

2. Description of the Related Art

Generally, in magnetic disk apparatus, a magnetic head assembly reads out/writes information on a magnetic disk of recording medium. A magnetic head assembly comprises a rotational arm rotating along a recording surface of a magnetic disk. On the tip of the rotational arm, a magnetic head for reading/writing information of magnetic disk is mounted.

In order to enable signal transmission between a control circuit provided on the body portion of a magnetic disk apparatus and the magnetic head mounted on the tip of the rotational arm, the control circuit and the magnetic head need to be electrically connected by use of a flexible printed circuit board or the like. A method of connecting a control circuit and a magnetic head of the related art is as follows. First, the magnetic head and a relay flexible printed circuit board (hereinafter referred to as a relay FPC board) are connected through a pattern of a conductive material formed on the rotational arm. The flexible printed circuit board connected to the control circuit (hereinafter referred to as an external side FPC board) is connected to the relay FPC board. The external side FPC board and the relay FPC board as well as the relay FPC board and the pattern are respectively connected by ultrasonic welding or solder fusion.

In such a method of connecting by ultrasonic welding or solder fusion, however, the connecting operation is complicated. This results in defects in connection. Specifically, in a method by using ultrasonic welding, gold plate covering the surfaces of the relay FPC board and the external side FPC board is peeled off.

Unexamined Patent Application Publication No. Hei 9-180380 proposes the following method. A connecting portion of the external side FPC board and a connecting portion of the relay FPC board are previously attached to the facing surfaces of two components constituting the rotational arm and the two connecting portions are connected to be sandwiched between the components in fabricating the rotational arm. The publication refers to the interposition of an adhesive having anisotropic conductivity between the connecting portions of the external side FPC board and the relay FPC board.

In the method disclosed in the above-mentioned Unexamined Patent Application Publication, the external side FPC board and the relay FPC board are connected in the rotational arm. It makes it impossible to work with the connecting condition observed. This results in poor workability. No detailed description is made for the method of connecting using an adhesive having anisotropic conductivity in the publication.

SUMMARY OF THE INVENTION

The present invention is designed to overcome the foregoing problems. It is an object of the invention to provide a magnetic head assembly with low defect in connection and good workability, and methods of manufacturing and wiring the same.

A method of wiring a magnetic head assembly according to this invention comprises the steps of: providing an arm side-wiring member, one end of which is electrically connected to the magnetic head and the other end of which has a first connecting portion, on the rotational arm; preparing an external side-wiring member, one end of which is connectable to the external circuit and the other end of which has a second connecting portion; and electrically connecting the arm side-wiring member and the external side-wiring member by overlapping the first connecting portion and the second connecting portion with a predetermined conductive adhesive member in between on the rotational arm.

In a method of wiring a magnetic head assembly according to this invention, the arm side-wiring member and the external side-wiring member are fixed, sandwiching a conductive adhesive member having anisotropic conductivity and connected to the arm side-wiring member and the external side-wiring member. The conductive adhesive member only has conductivity the direction of overlapping. This prevents conduction of each adjacent terminal even if there are a plurality of terminals in the first connecting portion of the arm side-wiring member or the second connecting portion of the external side-wiring member. The connection of the arm side-wiring member and the external side-wiring member on a predetermined exterior surface of the rotational arm facilitates the connection process.

In a method of wiring a magnetic head assembly according to this invention, desirably, a plurality of the arm side-wiring members are provided corresponding to the plurality of magnetic heads, respectively; and the first connecting portions of the plurality of arm side-wiring members and the second connecting portion of the external side-wiring member are connected in a single step in the connecting step. The rotational arm may comprise an arm tip counting the magnetic head and a rotatable arm body supporting the arm tip and the first connecting portions of the arm side-wiring members and the second connecting portion of the external side-wiring member may be overlapped in the connecting step.

Additionally, it is desirable that the connecting step comprises a step of curing of the conductive adhesive member. The conductive adhesive member may be thermosetting and heated to a temperature higher than that allowing the conductive adhesive member to be completely set in the step of curing. In this case, desirably, the conductive adhesive member is first heated to a temperature lower than that allowing the conductive adhesive member to be completely set before the step of curing. A desirable conductive adhesive member for use with this invention is an adhesive tape made of anisotropic conductive resin or a paste adhesive made of anisotropic conductive resin. Further, a flexible printed circuit board is desirable for the external side-wiring member.

Desirably, the arm side-wiring member is fabricated of the wiring pattern made of a conductive material formed on the rotational arm and the relay board for electrically connecting the wiring pattern and the external side-wiring member. In this case, the flexible printed circuit board can be used for the relay board. Further, it is desirable to include the step of overlapping and electrically connecting the relay board and the wiring pattern sandwiching a predetermined conductive adhesive member having anisotropic conductivity in the direction of overlapping.

A method of manufacturing a magnetic head assembly according to this invention comprises a step of wiring for electrically connecting the magnetic head and an external circuit, wherein the step is performed with the above-mentioned method of wiring a magnetic head assembly.

In a method of manufacturing a magnetic head assembly of the invention, it is desirable to provide the inspection terminal in the arm side-wiring member. In this case, desirable, before the above-mentioned step of wiring, the steps of: performing a predetermined inspection of the magnetic head with use of the inspection terminal of the arm side-wiring member; and removing the inspection terminal from the arm side-wiring member after the inspection are further comprised.

A magnetic head assembly of the invention comprises: a magnetic head; a rotational arm mounting the magnetic head; an arm side-wiring member, one end of which is electrically connected to the magnetic head and the other end of which has a first connecting portion, provided on the rotational arm; and an external side-wiring member, one end of which is able to electrically connected to an external circuit provided separately from the rotational arm and the other end of which has a second connecting portion, wherein the first connecting portion of the arm side-wiring member and the second connecting portion of the external side-wiring member are overlapped with a predetermined conductive adhesive member having anisotropic conductivity in between and electrically connected to each other on the rotational arm.

In a magnetic head assembly of the invention, desirably, the arm side-wiring member comprises a wiring pattern made of a conductive material formed on the rotational arm and a relay board electrically connecting the wiring pattern and the external side-wiring member, and the relay board and the wiring pattern are overlapped with a predetermined conductive adhesive member having anisotropic conductivity in between and electrically connected to each other.

Other and further objects, features and advantages of the invention will appear more fully from the following description.

DETAILED DESCRIPTION OF THE PREFERRED EMBODIMENTS

Embodiments of the invention will be described in detail below with reference to the accompanying drawings.

<Configuration of magnetic head assembly>

First, a configuration of a magnetic head assembly that is applied a method of wiring a magnetic head assembly according to an embodiment of the present invention will be described.

Figure 1:
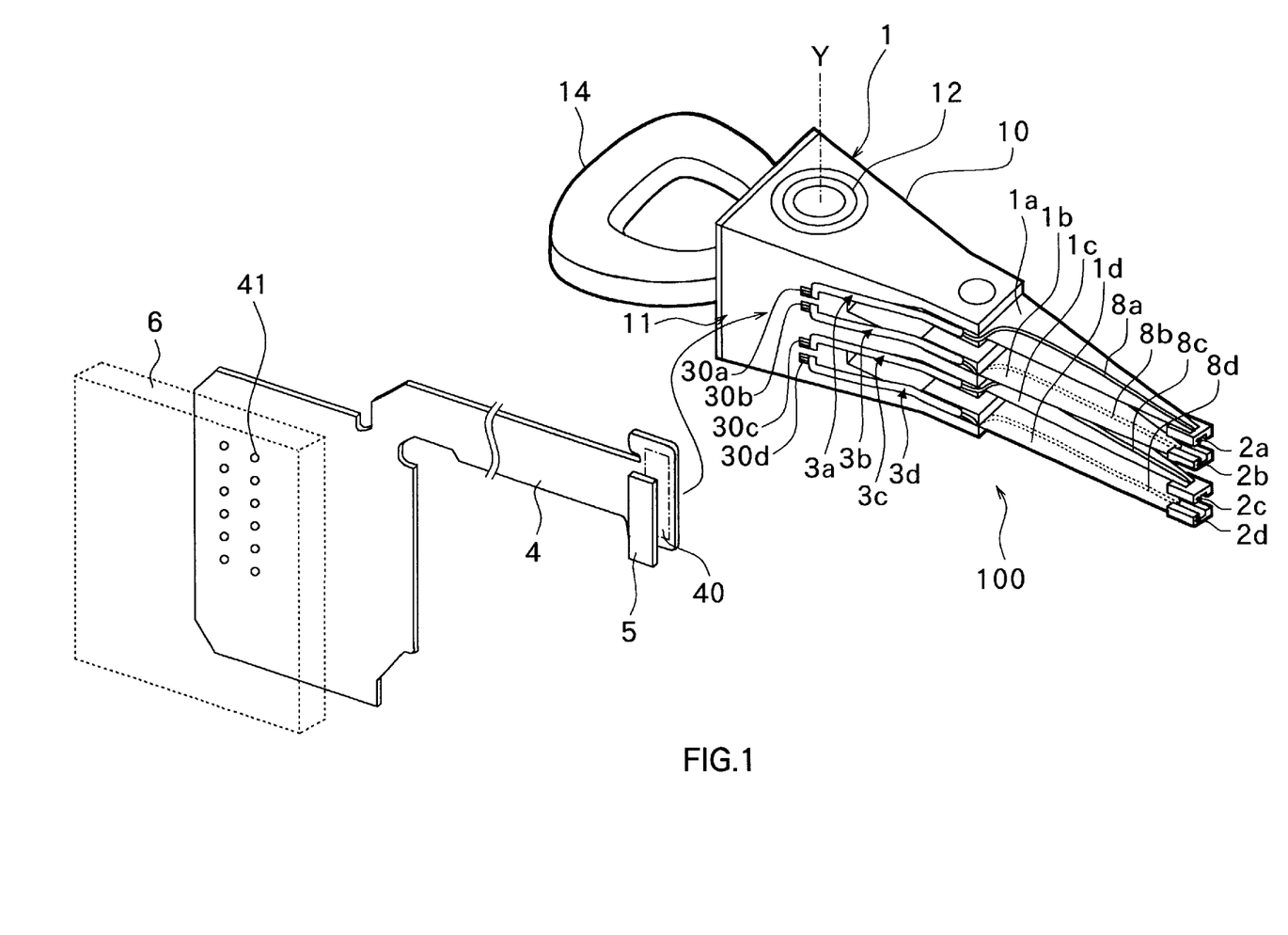
FIG. 1 is a perspective view showing a structure of a magnetic head assembly that is applied a method of wiring according to an embodiment of the invention.

FIG. 1 is a perspective view showing a configuration of a magnetic head assembly 100 that is applied a method of wiring a magnetic head assembly according to an embodiment. In a magnetic disk apparatus provided the magnetic head assembly 100, two magnetic disks of a recording medium (not shown) are rotatably supported with an axis centered, for instance. The magnetic head assembly 100 comprises a rotational arm 1 rotating with the axis Y, which is parallel to the rotation axis of the magnetic disk, centered. The rotational arm 1 comprises an arm body 10 as a solid block rotatably supported by a radial bearing 12 with the axis Y centered.

The rotational arm 1 comprises four arm tips 1a, 1b, 1c and 1d extended from the arm body 10 parallel to the surface and backside of the magnetic disk. The arm tips 1a to 1d are almost evenly spaced along the axis Y of the rotational arm 1 (in the vertical direction in FIG. 1). A driving coil 14 for driving the rotational arm 1 is attached to the arm body 10 of the opposite side of the arm tips 1a to 1d. The driving coil 14 constitutes a voice coil motor together with an unshown magnetic circuit provided as other part of the magnetic disk apparatus. More specifically, application of current to the driving coil 14 produces driving force for rotating the rotational arm 1 by an action with the magnetic field by the magnetic circuit.

On the tip of the arm tips 1a to 1d, magnetic heads 2a, 2b, 2c and 2d are respectively mounted to face the surface and backside of the magnetic disk. Each magnetic head 2a to 2d includes either or both of a reproducing head comprising, for example, magnetoresistive element (so called MR element), or/and a recording head comprising, for example, an inductive-type magnetic transducer.

Conductive patterns 8a, 8b, 8c and 8d are formed on the arm tips 1a to 1d by, for example, printing for signal transmission between each magnetic head 2a to 2d of the magnetic head assembly 100 and a control circuit 6 of the magnetic disk apparatus. One ends of the conductive patterns 8a to 8d are connected to the magnetic heads 2a to 2d and the other ends extend to the arm body 10, respectively. Four relay FPC boards 3a, 3b, 3c and 3d are provided on a side of the arm body 10 and one ends of the relay FPC boards 3a to 3d are connected to the conductive patterns 8a to 8d in the base of the arm tips 1a to 1d. The other ends of the relay FPC boards 3a to 3d are connected to an external side FPC board 4. The external side FPC board 4 comprises a connecting portion 40 to be connected to the relay FPC boards 3a to 3d at one end and a connector 41 to be able to connect to the control circuit 6 at the other end.

Figure 2:
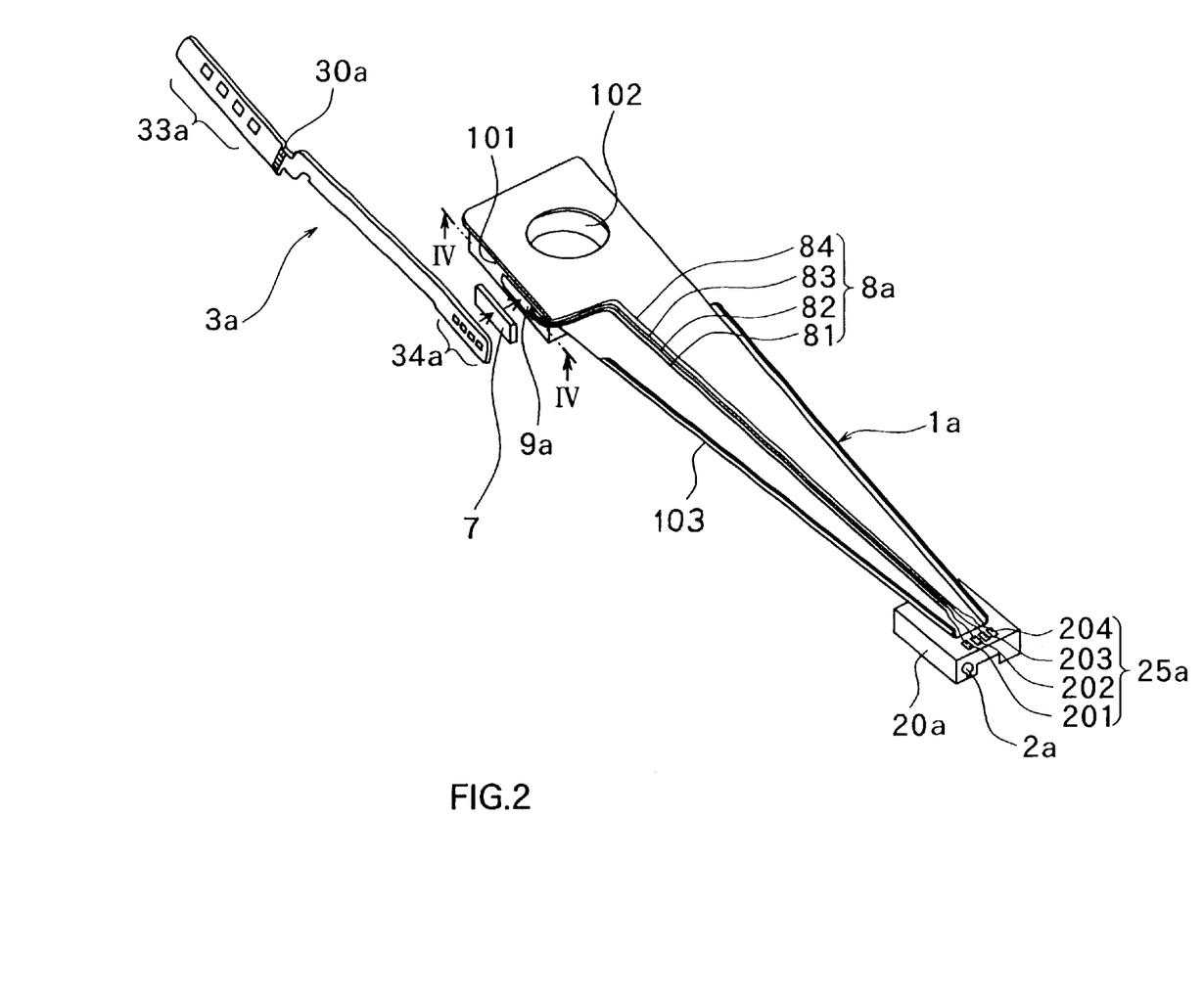
FIG. 2 is a perspective view showing a structure of the arm tip of the magnetic head assembly shown in FIG. 1.

FIG. 2 is a perspective view showing a structure of the arm tip 1a. The arm tip 1a is fabricated of a long plate 103 of metal in a thickness of, for example, about 0.05 mm and is fixed a mounting plate 101 of substantially square plate member to one end in the longitudinal direction. The mounting plate 101 is fixed to the bottom side of the arm tip 1a and to the arm body 10 through a mounting hole 102. To the bottom side of the long plate 103 of the opposite side of the mounting plate 101, almost cuboid shaped slider 20a is fixed. At an end face of the slider 20a, the magnetic head 2a is formed. A head terminal 25a consisted of four terminals 201, 202, 203 and 204 for signal input and output to the magnetic head 2a is formed on the top or end face of the slider 20a of FIG. 2.

On the top surface of the long plate 103 of the arm tip 1a, the conductive pattern 8a consisted of four wirings 81, 82, 83 and 84 made of conductive materials is formed. The wirings 81 to 84 of the conductive pattern 8a are connected to the terminals 201 to 204 of the head terminal 25a in the end of the long plate 103, respectively. The conductive pattern 8a extends toward the mounting plate 101 on the long plate 103 and bends approximately at a right angle just before reaching to the mounting plate 101. The bended conductive pattern 8a then reaches to the side end face of the mounting plate 101 and connects to a connecting pad 9a formed thereon.

The arm tips 1b to 1d are fabricated substantially similar to the arm tip 1a. However, as shown in FIG. 1, the arm tip 1b of the second step from the top comprises the magnetic head 2b on its top face and the conductive pattern 8b on its bottom face. Similarly, the arm tip 1d of the fourth step from the top comprises the magnetic head 2d on its top face and the conductive pattern 8d on its bottom face. On the other hand, the arm tip 1c of the third step from the top comprises the magnetic head 2c on its bottom face and the conductive pattern 8c on its top face.

Figure 3:
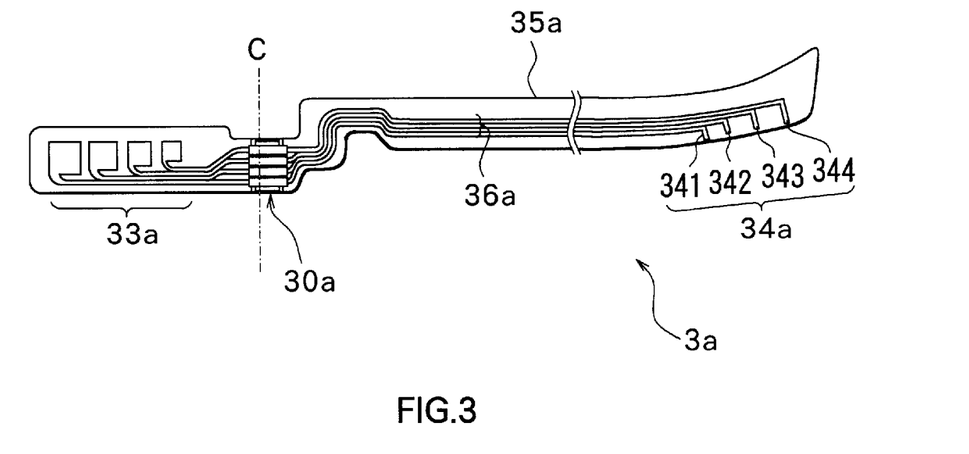
FIG. 3 is a plan view showing a structure of a relay FPC board according to the embodiment.

FIG. 3 shows the whole shape of the relay FPC board 3a. The relay FPC board 3a is formed of a flexible and long shaped base 35a made of polyimide and four wirings 36a formed thereon, for instance. A relay terminal 34a consisted of four terminals 341, 342, 343 and 344, which correspond to four wirings 36a, is formed at an end of the relay FPC board 3a in the longitudinal direction. A connecting terminal 30a for connecting to the external side FPC board 4 is formed in approximately the center of the relay FPC board 3a in the longitudinal direction. The connecting terminal 30a is consisted of four terminals correspond to four wirings 36a. An inspection terminal 33a is formed at the other side of the relay terminal 34a sandwiching the connecting terminal 30a of the relay FPC board 3a.

The inspection terminal 33a is used for inspecting the magnetic head 3a or the like before connecting the relay FPC board 3a to the external side FPC board 4. After later-described inspection of the magnetic head 3a, the inspection terminal 33a is cut in the part indicated by a chain line C in FIG. 3 and separated from the relay FPC board 3a. As a result, the connecting terminal 30a is positioned at an end of the relay FPC board 3a.

The structures of the other relay FPC boards 3b, 3c and 3d are similar to that of the relay FPC board 3a so the illustration and the description thereof are omitted.

Figure 4:
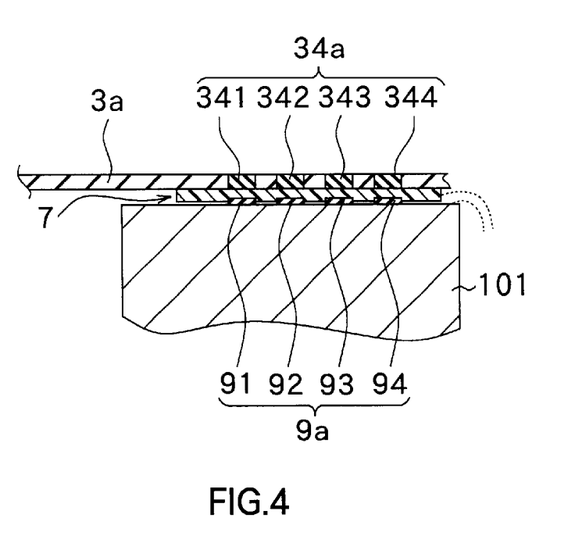
FIG. 4 is a sectional view showing a state that the relay FPC board shown in FIG. 3 is attached to the arm tip.

FIG. 4 is a sectional view taken along line IV—IV of FIG. 3 for describing the connecting condition of the relay FPC board 3a and the connecting pad 9a of the arm tip 1a. The connecting pad 9a formed on a side of the mounting plate 101 of the arm tip 1a is consisted of four terminals 91, 92, 93 and 94, each connected to the wirings 81, 82, 83 and 84 (see FIG. 2) of the conductive pattern 8. The terminals 91, 92, 93 and 94 of the connecting pad 9a are spaced same apart as the terminals 341, 342, 343 and 344 of the relay terminal 34a. For the connection of the relay terminal 34a of the relay FPC board 3a and the connecting pad 9a, an anisotropic conductive tape 7 made of anisotropic conductive resin having conductivity only to the direction of thickness is used. In other words, the relay terminal 34a and the connecting pad 9a are adhered to face each terminal 341 to 344 and 91 to 94 with the anisotropic conductive tape 7 in between.

A tape having a cure temperature of about 150° C. and exhibiting a certain adhesion with heating to about 100° C. is desirable as the anisotropic conductive tape 7. Specifically, CP series (product name) manufactured by Sony Chemicals Corporation or the like is used. A paste adhesive of anisotropic conductive resin may be used instead of the anisotropic conductive tape 7. The anisotropic conductive tape 7 has conductivity only to the direction of thickness. This prevents conduction of each terminal of the relay terminal 34a or that of the connecting pad 9a.

Figure 5:
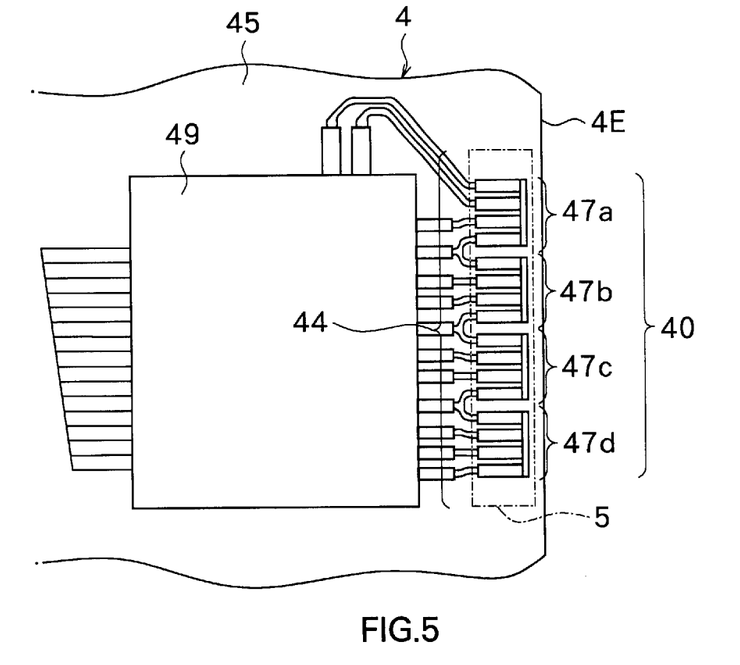
FIG. 5 is a view showing a vicinity of a connecting portion of an external side FPC board.

FIG. 5 is an enlarged plan view showing part of the external side FPC board 4. A number of wirings 44 formed on a flexible base 45 made of, for example, polyimide for signal transmission with the magnetic heads 2a to 2d forms the external side FPC board 4. Each wiring 44 extends to an end edge 4E of the external side FPC board 4 and terminals 47a, 47b, 47c and 47d of the end of the wirings 44 are aligned along the end edge 4E. Each terminal 47a to 47d is used for signal transmission with the magnetic heads 2a to 2d and constitutes the connecting portion 40 of the external side FPC board 4. The component indicated by reference numeral 49 in FIG. 5 is IC chip. The IC chip 49 performs generation of recording current, amplification of reproducing signal, and switching recording and reproducing to the magnetic heads 2a to 2d.

The connecting portion 40 of the external side FPC board 4 and the connecting terminals 30a, 30b, 30c and 30d formed in the relay FPC boards 3a to 3d are connected with an anisotropic conductive tape 5 exhibiting conductivity only in the direction of thickness like the above-described anisotropic conductive tape 7. The anisotropic conductive tape 5 has enough width and length to completely cover the connecting portion 40. A tape having a cure temperature of about 150° C. and exhibiting a certain adhesion under heating to about 100° C. is desirable as the anisotropic conductive tape 5. CP series (product name) manufactured by Sony Chemicals Corporation or the like can be used, for instance. A paste adhesive of anisotropic conductive resin may be used instead of the anisotropic conductive tape 5.

Figure 6:
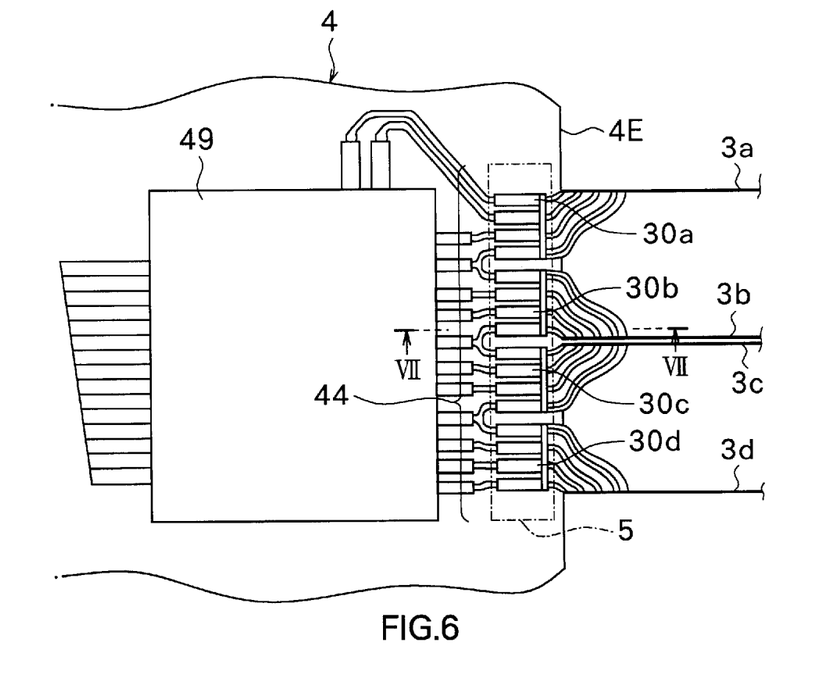
FIG. 6 is a view showing a state that the connecting portions of the external side FPC board and the relay FPC board are connected.
Figure 7:
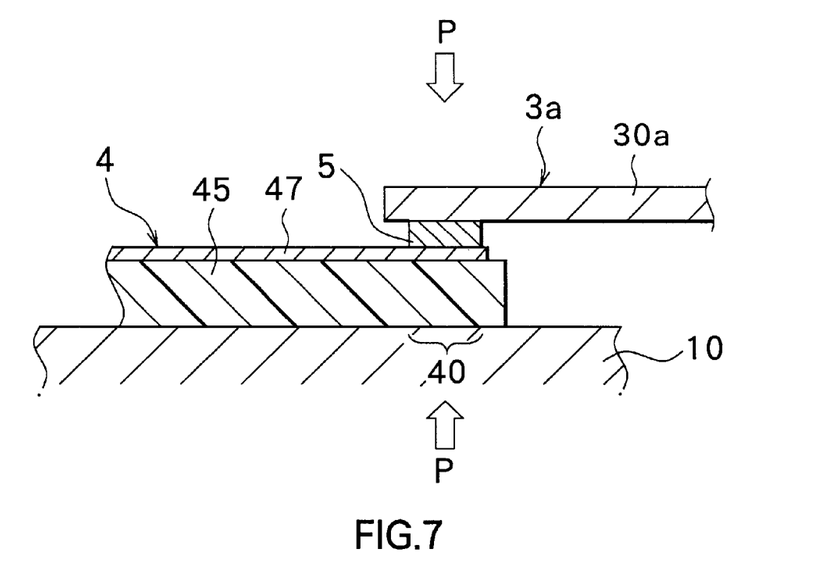
FIG. 7 is a sectional view showing the sectional structure of the connecting portion shown in FIG. 6.

FIG. 6 is a plan and sectional view showing the state that the connecting portion 40 and the connecting terminals 30a to 30d are overlapped. FIG. 7 is a sectional view of FIG. 6 taken along line VII—VII. As shown in FIG. 7, the connecting terminals 30a to 30d are respectively overlapped on the connecting portion 40 sandwiching the anisotropic conductive tape 5. The anisotropic conductive tape 5 has conductivity only to the direction of thickness. This prevents conduction of each connecting terminal 30a to 30d or that of the connecting portion 40.

The external side FPC board 4 corresponds to a specific example of the "the external side-wiring member" of the invention. The relay FPC boards 3a to 3d and the conductive patterns 8a to 8d correspond to a specific example of the "arm side-wiring member" of the invention. Further, the anisotropic conductive tape 5 corresponds to a specific example of the "conductive adhesive member" of the invention. Moreover, the magnetic heads 2a to 2d correspond to a specific example of the "magnetic head" of the invention and the rotational arm 1 corresponds to a specific example of the "rotational arm" of the invention.

<A method of manufacturing a magnetic head assembly>

Figure 8:
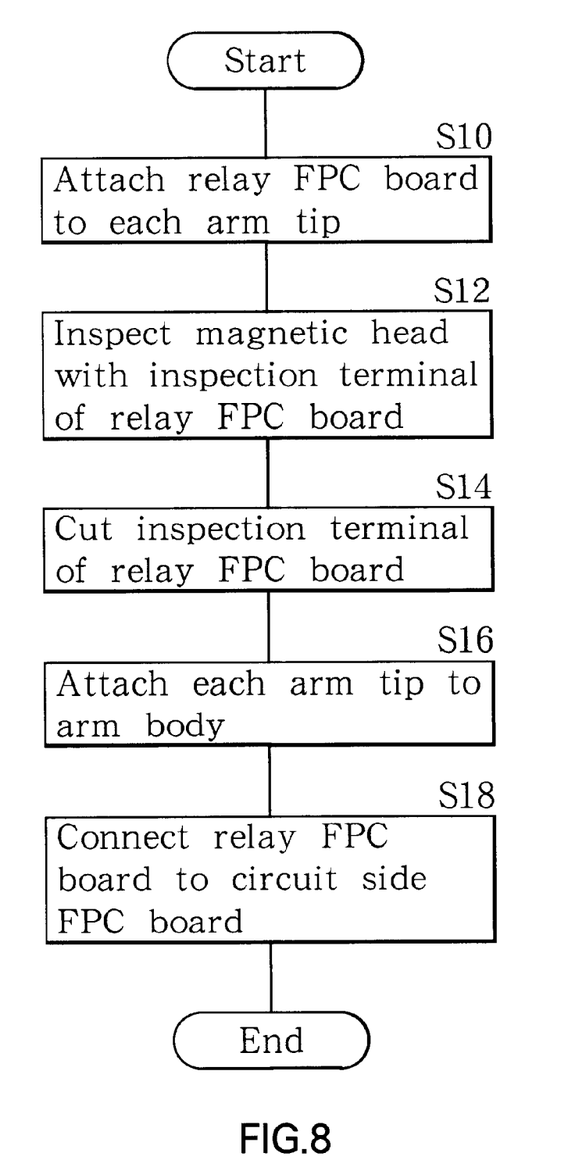
FIG. 8 is a flow chart showing a method of manufacturing the magnetic head assembly according to the embodiment of the invention.

Description will now be made for a method of manufacturing a magnetic head assembly according to the embodiment. FIG. 8 is a flow chart showing a method of manufacturing the same and each step will be described along the flow chart.

First, as shown in FIG. 2, a relay FPC board 2a is attached to the arm tip 1a (S10). In other words, the connecting pad 9a provided on the mounting plate 101 of the arm tip 1a and the relay terminal 34a of the relay FPC board 3a are fixed and connected sandwiching the anisotropic conductive tape 7. Specifically, the anisotropic conductive tape 7 is adhered to the connecting pad 9a with heating to below its cure temperature, for example, at 100° C. and then the relay terminal 34a is adhere to the anisotropic conductive tape 7. At this time, the position of the relay terminal 34a is adjusted to face each terminal 341, 342, 343 and 344 of the relay terminal 34a (see FIG. 5) and each terminal 91, 92, 93 and 94 of the connecting pad 9a by using, for example, a microscope. It is possible to readhere the relay terminal 34a for adjusting its position because the anisotropic conductive tape 7 incompletely sets.

Subsequently, the anisotropic conductive tape 7 is pressed with heating at a temperature of, for example, 150° C., which is slightly higher than its cure temperature, thereby set the anisotropic conductive tape 7. After that, the relay terminal 34a and the connecting pad 9a are fixed and connected. The anisotropic conductive tape 7 may be first adhered to the relay terminal 34a and then adhere the connecting pad 9a thereto. Alternatively, in overlapping the relay terminal 34a and the connecting pad 9a, the anisotropic conductive tape 7 may be sandwiched therebetween.

Similar to the above-described method, each terminal of relay FPC boards 3b, 3c and 3d is connected to each connecting pad of the arm tips 1b, 1c and 1d.

The magnetic heads 2a to 2d are respectively inspected with the inspection terminals 33a to 33d of the relay FPC boards 3a to 3d (S12). A dynamic characteristic with use of a magnetic disk, MR resistance and so on are inspected. Specific description of the method of inspection is omitted. After completing the inspection of the magnetic heads 2a to 2d, the inspection terminals 33a to 33d are cut off and removed (S14).

Figure 9:
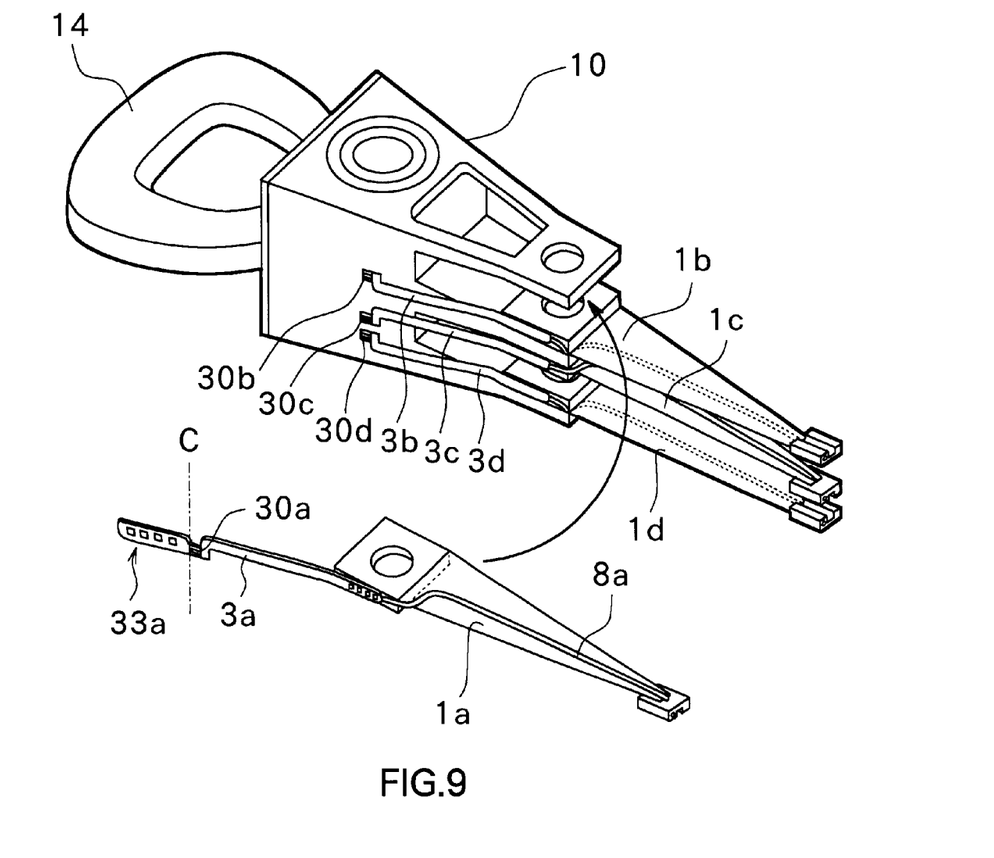
FIG. 9 is a perspective view showing a step of the method of manufacturing the magnetic head assembly according to the embodiment of the invention.

The arm tips 1a to 1d attached the relay FPC boards 3a to 3d are sequentially attached to the arm body 10 as shown in FIG. 9 (S16). The arm tips 1a to 1d attached to the arm body 10 by fitting fixtures (not shown) to each mounting hole 102 of the arm tips 1a to 1d. With the arm tips 1a to 1d are attached to the arm body 10, each connecting portion 30a to 30d of the relay FPC boards 3a to 3d reaches to a side 11 of the arm body 10.

As shown in FIG. 1, the relay FPC boards 3a to 3d are connected to the connecting portion 40 of the external side FPC board 4 (S18). Specifically, first, the external side FPC board 4 is adhered to the side 11 of the arm body 10 with the connecting portion 40 turned outside. The anisotropic conductive tape 5 is adhered to the connecting portion 40 with heating to below its cure temperature, for example, at 100° C. and then the connecting terminals 30a to 30d of the relay FPC boards 3a to 3d are adhere to the anisotropic conductive tape 5. At this time, the position of the connecting terminals 30a to 30d is adjusted to face each terminal 47a to 47d of the connecting portion 40 and each terminal 30a to 30d. It is possible to readhere the connecting terminals 30a to 30d because the anisotropic conductive tape 5 incompletely sets. Subsequently, the anisotropic conductive tape 5 is pressed with heating at a temperature of, for example, 150° C., which is slightly higher than its cure temperature, thereby set the anisotropic conductive tape 5. After that, the connecting portion 40 and the connecting terminals 30a to 30d are fixed and connected.

The anisotropic conductive tape 5 may be first adhered to the connecting terminals 30a to 30d and then the connecting portion 40 is adhered thereto. Alternatively, in overlapping the connecting portion 40 and the connecting terminals 30a to 30d, the anisotropic conductive tape 5 may be sandwiched therebetween.

Thus, the magnetic head assembly 100 shown in FIG. 1 is manufactured.

<Effects of the embodiment>

As described above, according to the method of wiring a magnetic head assembly of this embodiment, the connecting portion 40 of the external side FPC board 4 and the connecting terminals 30a to 30d of the relay FPC boards 3a to 3d are overlapped and fixed by the anisotropic conductive tape 5. This enables to connect a plurality of wirings of both connecting portions in a single step. As a result, defects in connection are reduced and connecting process is simplified as compared to the individual connection by each wiring. This also prevents peeling of gold plate formed on, for example, the external side FPC board 4 without using ultrasonic welding. The connecting portion 40 of the external side FPC board 4 is connected to the connecting terminals 30a to 30d of the relay FPC board 3a to 3d on the side 11 of the arm body 10. This enables to operate with observing the connecting condition and therefore the workability is improved.

The relay terminals 34a to 34d of the relay FPC boards 3a to 3d are connected to the connecting pad of the arm tips 1a to id with the anisotropic conductive tape 7. As a result, connecting process is simplified and defects in connection are reduced. Further, as shown in FIG. 2, the component, which is the relay FPC board 3a is attached to the arm tip 1a, can be treated as a unit and therefore the workability in manufacturing is improved.

In overlapping the connecting terminal 40 of the external side FPC board 4 and the connecting terminals 30a to 30d of the relay FPC boards 3a to 3d, the anisotropic conductive tape 5 is heated to, for example, 100° C. to temporarily fix the connecting terminal 40 and the connecting terminals 30a to 30d. This prevents a deviation of the relative position of both connecting portions before complete set of the anisotropic conductive tape 5.

Although the present invention has been described by some embodiments and examples, the invention is not limited to the foregoing embodiments and examples but can be variously modified. For example, in FIG. 1, as an alternative to using the relay FPC boards 3a, 3b, 3c and 3d, the conductive patterns 8a, 8b, 8c and 8d may be formed to extend to the side 11 of the arm body 10 and be connected the connecting portion 40 of the external side FPC board 4 to its one end. In this case, the anisotropic conductive tape 5 can be used. The number of arm tips may be unlimited.

As described above, according to a magnetic head assembly and methods of wiring and manufacturing the same of the invention, the connecting portions of the external side-wiring member and of the arm side-wiring member are overlapped and connected with a conductive adhesive member having anisotropic conductivity in between. As a result, it is easy to connect as compared to ultrasonic welding or solder fusion, for instance. The connecting portions are overlapped on a predetermined exterior surface of the rotational arm. This enables to operate with observing the connecting condition and therefore reduce defects in connection.

According to a method of wiring a magnetic head assembly of the invention, the external side-wiring member and a plurality of arm side-wiring members are connected in a single step. This enables to further improve the workability.

According to a method of wiring a magnetic head assembly of the invention, the conductive pattern forms the arm side-wiring member and the relay board are connected with a conductive adhesive member having anisotropic conductivity. This enables to further simplify the connecting process.

According to a magnetic head assembly and a method of manufacturing the same of the invention, a predetermined inspection with the inspection terminal of the arm side-wiring member for a magnetic head is performed before connecting the external side-wiring member and the arm side-wiring member. After that, the inspection terminal is removed form the arm side-wiring member. As a result, the quality of a magnetic head is easily inspected in fabricating a magnetic head assembly. Separation and removal of the inspection terminal from the arm side-wiring member saves space in a magnetic disk apparatus, for example.

Obviously many modifications and variations of the present invention are possible in the light of the above teachings. It is therefore to be understood that within the scope of the appended claims the invention may be practiced otherwise than as specifically described.

What is claimed is:

1. A method of wiring a magnetic head assembly having a rotational arm mounting a magnetic head, for electrically connecting the magnetic head to an external circuit provided separately form the rotational arm, the method comprising the steps of;

providing an arm side-wiring member, one end is electrically connected to the magnetic head and the other end has a first connecting portion, on the rotational arm;

preparing an external side-wiring member, one end is connectable to the external circuit and the other end has a second connecting portion; and electrically connecting the arm side-wiring member and the external side-wiring member by overlapping the first connecting portion and the second connecting portion with a predetermined conductive adhesive member in between, on the rotational arm, wherein the conductive adhesive member has anisotropic conductivity in a direction of overlapping of the first and the second connecting portions.

2. A method of wiring a magnetic head assembly according to claim 1, wherein in the case where the rotational arm mounts a plurality of magnetic heads;

a plurality of the arm-side-wiring members is provided corresponding to the plurality of magnetic heads, respectively; and the first connecting portions of the plurality of arm side-wiring members and the second connecting portion of the external side-wiring member are connected in a single step in the connecting step.

3. A method of wiring a magnetic head assembly according to claim 1, wherein in the case where the rotational arm comprises an arm tip mounting the magnetic head and a rotatable arm body supporting the arm tip, the first connecting portions and the second connecting portion are overlapped on the arm body in the connecting step.

4. A method of wiring a magnetic head assembly according to claim 1, wherein the connecting step includes a step of curing of the conductive adhesive member.

5. A method of wiring a magnetic head assembly according to claim 4, wherein;

the conductive adhesive member is thermosetting; and the conductive adhesive member is heated to a temperature higher than that allowing the conductive adhesive member to be completely set in the step of curing.

6. A method of wiring a magnetic head assembly according to claim 5, wherein a step of heating the conductive adhesive member at a temperature lower than that allowing the conductive adhesive member to be completely set is performed before the step of curing.

7. A method of wiring a magnetic head assembly according to claim 1, wherein an adhesive tape made of anisotropic conductive resin is used as the conductive adhesive member.

8. A method of wiring a magnetic head assembly according to claim 1, wherein a paste adhesive made of anisotropic conductive resin is used as the conductive adhesive member.

9. A method of wiring a magnetic head assembly according to claim 1, wherein a flexible printed circuit board is used as the external side-wiring member.

10. A method of wiring a magnetic head assembly according to claim 1, wherein the arm side-wiring member comprises a wiring pattern made of a conductive material formed on the rotational arm and a relay board for electrically connecting the wiring pattern and the external side-wiring member.

11. A method of wiring a magnetic head assembly according to claim 10, further comprising a step of overlapping and electrically connecting the relay board and the wiring pattern with a predetermined conductive adhesive member in between, wherein the conductive adhesive member has anisotropic conductivity in the direction of overlapping.

12. A method of wiring a magnetic head assembly according to claim 10, wherein a flexible printed circuit board is used as the relay board.

13. A method of manufacturing a magnetic head assembly having a rotational arm mounting a magnetic head, the method comprising a step of wiring for electrically connecting the a magnetic head and an external circuit, wherein the step is performed with the method of wiring a magnetic head assembly according to claim 1.

14. A method of manufacturing a magnetic head assembly according to claim 13, wherein an inspection terminal is provided on the arm side-wiring member.

15. A method of manufacturing a magnetic head assembly according to claim 14, further comprising, before the step of wiring, the steps of:

performing a predetermined inspection of the magnetic head with use of the inspection terminal of the arm side-wiring member; and removing the inspection terminal from the arm side-wiring member after the predetermined inspection.

* * * * *